US005189703A

United States Patent [19]

Holman

[11] Patent Number: 5,189,703

[45] Date of Patent: Feb. 23, 1993

[54] TIMBRE CORRECTION UNITS FOR USE IN SOUND SYSTEMS

[75] Inventor: Tomlinson Holman, Fairfax, Calif.

[73] Assignee: LucasArts Entertainment Company, San Rafael, Calif.

[21] Appl. No.: 707,118

[22] Filed: May 28, 1991

Related U.S. Application Data

[60] Division of Ser. No. 366,991, Jun. 20, 1989, which is a continuation-in-part of Ser. No. 141,570, Jan. 6, 1988.

[51] Int. Cl.[5] ........................ H03G 3/00; H03G 5/00; H04M 1/24

[52] U.S. Cl. ........................................ 381/61; 381/22; 381/1; 381/98

[58] Field of Search .................... 381/1, 98, 22, 27, 28, 381/61, 63

[56] References Cited

U.S. PATENT DOCUMENTS

| | | | |
|---|---|---|---|
| 3,761,628 | 9/1973 | Bauer | 381/23 |
| 3,836,715 | 9/1974 | Ito et al. | 381/22 |
| 4,464,781 | 8/1984 | Kaneko et al. | 381/98 |
| 4,696,036 | 9/1987 | Julstrom | 381/22 |
| 4,799,260 | 1/1989 | Mandell et al. | 381/22 |
| 4,984,273 | 1/1991 | Aylward et al. | 381/98 |

OTHER PUBLICATIONS

"The Influence of Room Boundaries on Loudspeaker Power Output" by Roy F. Allison J. Audio Eng. Soc., vol. 22, No. 5, Jun. 1974, pp. 314–320.

"Transformation of Sound Pressure Level from the Free Field to the Eardrum in the Horizontal Plane," E. A. G. Shaw, J. Acoust. Soc. Am., Dec. 1974, pp. 1848–1861.

"From Instrument to Ear in a Room: Direct or via Recording" by A. H. Benade, J. Audio Eng. Soc., vol., 33, No. 4, Apr. 1985, pp. 218–233.

"Listening to Sound in Rooms" by W. M. Hartmann (abstract), J. Acoust. Soc. Am. Suppl. 1, vol. 83, Spring 1988, p. S74.

"Temporal Window Shape as a Function of Frequency and Level" by Christopher J. J. Plack et al, J. Acoust. Soc. Am., May 1990, pp. 2178–2187.

"New Factors in Sound for Cinema and Television" by Tomlinson Holman, J. Audio Eng. Soc., vol. 39, No. 7/8, Jul./Aug. 1991, pp. 529–539.

*Primary Examiner*—James L. Dwyer
*Assistant Examiner*—Jack Chiang
*Attorney, Agent, or Firm*—Thomas A. Gallagher

[57] ABSTRACT

Spectral imbalance when playing home video versions of motion pictures is overcome by a frequency response correction unit which compensates for the equalization employed during the production of motion picture sound tracks designed for playback over the standard X-curve. In addition, the frequency response correction unit may additionally or instead compensate for listener-perceived differences in the frequency response between the surround sound channel and main sound channels.

17 Claims, 4 Drawing Sheets

REAL AXIS POLE: (2π)15k RAD/SEC

COORDINATES:
$\alpha_{RP} = -9.4248 \times 10^4$

DID EQUALIZER SECTION: $\omega_0 = (2\pi)\,12.13k$ RAD/SEC $\theta_P = 51.88°$ ⟶ $\alpha_P \pm j\beta_P = -4.7046 \times 10^4 \pm j5.9962 \times 10^4$ $\theta_Z = 63.10°$ ⟶ $\alpha_Z \pm j\beta_Z = -3.4485 \times 10^4 \pm j6.7967 \times 10^4$

TIMBRE CORRECTION UNITS FOR USE IN SOUND SYSTEMS

CROSS-REFERENCE TO RELATED APPLICATION

This is a division of application Ser. No. 07/366,991, filed Jun. 20, 1989, which is a continuation-in-part of application Ser. No. 07/141,570, filed Jan. 6, 1988.

BACKGROUND OF THE INVENTION

The invention relates generally to sound reproduction. More specifically, the invention relates to multiple channel sound reproduction systems having improved listener perceived characteristics.

Multiple channel sound reproduction systems which include a surround-sound channel (often referred to in the past as an "ambience" or "special-effects" channel) in addition to left and right (and optimally, center) sound channels are now relatively common in motion picture theaters and are becoming more and more common in the homes of consumers. A driving force behind the proliferation of such systems in consumers' homes is the widespread availability of surround-sound home video software, mainly surround-sound motion pictures (movies) made for theatrical release and subsequently transferred to home video media (e.g., videocassettes, video-discs, and broadcast and cable television).

When a motion picture is transferred from film to home video media, the soundtrack of the motion picture film is transferred essentially unaltered: the soundtrack on the home video medium is essentially an exact duplicate of the soundtrack on the film. Where reference is made below to playing a motion picture soundtrack in the home, it is to be understood that what is actually played in the home is some form of home video medium onto which the motion picture soundtrack has been transferred in an essentially unaltered form.

Although home video media have two-channel stereophonic soundtracks, those two channels carry, by means of amplitude and phase matrix encoding, four channels of sound information—left, center, right, and surround, usually identical to the two-channel stereophonic motion-picture soundtracks from which the home video soundtracks are derived. As is also done in the motion picture theater, the left, center, right, and surround channels are decoded and recovered by consumers with a matrix decoder, usually referred to as a "surround-sound" decoder. In the home environment, the decoder is usually incorporated in or is an accessory to a videocassette player, videodisc player, or television set/video monitor.

Motion picture theaters equipped for surround sound typically have at least three sets of loudspeakers, located appropriately for reproduction of the left, center, and right channels, at the front of the theater auditorium, behind the screen. The surround channel is usually applied to a multiplicity of speakers located other than at the front of the theater auditorium.

It is the recommended and common practice in the industry to align the sound system of large auditoriums, particularly a motion picture theater's loudspeaker-room response, to a standardized frequency response curve or "house curve." The current standardized house curve for movie theaters is a recommendation of the International Standards Organization designated as curve X of ISO 2969-1977(E), commonly known as the X-curve.

The X-curve is a curve having a significant high-frequency rolloff. The curve is the result of subjective listening tests conducted in large (theater-sized) auditoriums. A basic rationale for such a curve is given by Robert B. Schulein in his article *In Situ Measurement and Equalization of Sound Reproduction Systems*, J. Audio Eng. Soc., April 1975, Vol. 23, No. 3, pp. 178–186. Schulein explains that the requirement for high-frequency rolloff is apparently due to the free field (i.e., direct) to diffuse (i.e., reflected or reverberant) sound field diffraction effects of the human head and ears. A distant loudspeaker in a large listening room is perceived by listeners as having greater high frequency output (i.e., to sound brighter) than a closer loudspeaker aligned to measure the same response. This appears to be a result of the substantial diffuse field to free field ratio generated by the distant loudspeaker; a loudspeaker close to a listener generates such a small diffuse to direct sound ratio as to be insignificant.

More recently the rationale has been carried further by Gunther Theile (*On the standardization of the Frequency Response of High-Quality Studio Headphones*, J. Audio Eng. Soc., December 1986, Vol. 34, No. 12, pp. 956–969) who hypothesized that perceptions of loudness and tone color (timbre) are not completely determined by sound pressure and spectrum in the auditory canal. Theile relates this hypothesis to the "source location effect" or "sound level loudness divergence" ("SLD") which occurs whenever auditory events with differing locations are compared: a nearer loudspeaker requires more sound level (sound pressure) at the ear drums to cause the same perceived sound loudness as a more distant loudspeaker and the effect is frequency dependent.

It has also been recognized that the sound pressure level in a free (direct) field exceeds that in a diffuse field for equal loudness. A standard equalization, currently embodied in ISO 454-1975 (E) of the International Standards Organization, is intended to compensate for the differences in perceived loudness and, by extension, timbre due to frequency response changes between such sound fields.

Perceived sound loudness and timbre thus depends not only on the location at which sound fields are generated with respect to the listener but also on the relative diffuse (reflected or reverberant) field component to free (direct) field component ratio of the sound field at the listener.

The use of the standardized X-curve in motion picture theatres is significant because in the final steps of mixing motion picture soundtracks, the soundtracks are almost always monitored in large (theater-sized) auditoriums ("mixing" and "dubbing" theaters) whose loudspeaker-room responses have been aligned to the standardized response curve. This is done, of course, with the expectation that such motion picture films will be played in large (theater-sized) auditoriums that have been aligned to the same standardized response curve. Aligning both the sound system of the dubbing theatre and the sound system of the public motion picture theatre to the X-curve ensures that a film sounds in the public theatre very similar to the way it sounded in the dubbing theatre, and, in particular, that the timbre of the film sounds neutral (i.e., neither overly bright nor overly dull) in both the dubbing theatre and in the public motion picture theatre.

Although aligning theatre sound systems to the X-curve enables films to sound have a neutral timbre in both the dubbing theatre and the public motion picture theatre, it does not necessarily allow a film to have the same neutral timbre when transferred to another medium, such as a home video tape or disk. This is because the X-curve *overcorrects* the tendency of a loudspeaker to sound bright in a large room. A large room loudspeaker system aligned to the X-curve therefore sounds dull. Thus, when dubbing the film sound track in a dubbing theatre aligned to the X-curve, the mixing engineer will boost the level of the high-frequency parts of the program material to compensate for the dulling effect of the X-curve aligned dubbing theatre (and also the X-curve aligned public motion picture theatre) so that the timbre of the program material sounds neutral as heard by the mixing engineer in the dubbing theatre. Consequently, motion picture soundtracks inherently carry a built-in high-frequency frequency response boost that takes into account or compensates for playback in large (theater-sized) auditoriums whose loudspeaker-room responses are aligned to the standardized curve.

The loudspeaker arrangement in a typical domestic surround sound system mimics that of the motion picture theatre. The outputs of the surround-sound decoder are fed, via suitable power amplifiers, to normal domestic loudspeakers arranged one to the left and one to the right of the video monitor, and to at least two normal domestic loudspeakers arranged behind or to the sides of the main listening/viewing area. Additionally, a center channel signal may be fed to a center channel loudspeaker arranged above or below the video monitor. Although standard in motion picture theater environments, the center loudspeaker is often omitted in home systems. A phantom center sound image is created by feeding the center channel signal equally to the left and right loudspeakers.

One major difference between the home listening environment and the motion picture theater listening environment is in the relative sizes of the rooms—the typical home living room, of course, being much smaller than the typical motion picture theatre. This size difference means that a typical loudspeaker does not sound overly bright in a home living-room sized room. Consequently, there is no need to apply the high-frequency rolloff X-curve applicable to large auditoriums to the considerably smaller home living room sized room because of the above-mentioned effects.

Recorded consumer sound media (e.g., vinyl phonograph records, cassette tapes, compact discs, etc.) are monitored when they are made in relatively small (home living room sized) monitoring studios using loudspeakers which are the same or similar to those typically used in homes. In particular, the sound systems used in the mixdown rooms of music recording studios sound relatively neutral, and do not sound dull like the sound systems in film dubbing theatres. Relative to the room-loudspeaker systems in theatres, the response of a typical modern home room-loudspeaker system or a small studio room-loudspeaker system can be characterized as substantially neutral, particularly in the high-frequency region in which the X-curve applies excessive rolloff in the large auditorium. A consequence of this is that motion pictures transferred to home video media have too much high frequency sound when reproduced by a home system. Consequently, the musical portions of motion picture soundtracks played on home systems tend to sound "bright." In addition, other undesirable results occur—"Foley" sound effects, such as the rustling of clothing, etc., which tend to have substantial high-frequency content, are over-emphasized. Also, the increased high-frequency output when motion picture soundtracks are played on home systems often reveals details in the makeup of the soundtrack that are not intended to be heard by listeners; for example, changes in soundtrack noise level as dialogue tracks are cut in and out. These same problems, of course, occur when a motion picture soundtrack is played back in any small listening environment having consumer-type loudspeakers, such as small monitoring studios.

It should also be understood that the above remarks regarding motion picture soundtracks generally do not apply to the soundtracks of motion pictures originating in the music industry, for example, music videos. The music industry usually mixes its motion picture soundtracks in small, home-sized, studios, so that its soundtracks do not have the timbre errors of soundtracks originating in the film industry.

Also, in both home and theater systems, including the above-mentioned high-quality theater sound systems, no compensation has been employed for the differences in listener-perceived timbre between the main channels and the surround channel. For example, sounds which move from the main channels to the surround channel or vice-versa (sounds "panned" off or onto the viewing screen) undergo timbral shifts. Such shifts in timbre can be so severe as to harm the ability of the listener to believe that the sound is coming from the same sound source as the sound is panned.

The inventor has discovered that the above mentioned equalization standard, currently embodied in ISO 454-1975 (E) of the International Standards Organization, which is a measure of the timbre difference between a direct sound field and a diffuse sound field, cannot be used as a basis to compensate properly for the listener-perceived timbre differences between the main and surrounds channels.

The inventor believes that there are two main causes for the listener—perceived timbral shift between the main and surround channels. The first is timbre changes due to comb filtering. Comb filtering may arise from the operation of multiple surround loudspeakers or from deliberately added electronic comb filters used to simulate a surround array with only two loudspeakers. The second cause is frequency response differences due to the human head related transfer function (i.e., the difference between the frequency response measured by a microphone along and the frequency response measured by a microphone at the bottom of the ear canal, close to the eardrum; the difference being caused by the presence of the head in the sound field and the effects of the pinna and the ear canal). In addition, the difference in character between the direct sound field generated by the main channel loudspeakers and the diffuse sound field generated by the surround channel loudspeakers may be an additional factor.

SUMMARY OF THE INVENTION

The invention is directed to improving the accuracy and fidelity of surround sound reproduction systems. The invention is directed primarily to surround-sound reproduction systems in relatively small rooms, particularly those in homes; however, some aspects of the invention apply to rooms of all sizes, from small (home-sized) rooms to large (theatre-sized) auditoriums.

One aspect of the invention solves the problem of soundtrack timbral errors, particularly excessive high-frequency energy, that become noticeable when a soundtrack that has been mixed in a large (theatre-sized) auditorium whose room-loudspeaker system is aligned to a frequency response curve having an excessive significant high-frequency rolloff is played in a small room. In a preferred embodiment, soundtrack timbre correction according to a fixed correction curve determined by the inventor is provided in the home playback system to restore a neutral timbre to motion picture soundtracks having a boosted high-frequency content because they were mixed in large (theater-sized) auditoriums aligned to the X-curve. Such a soundtrack timbre correction enables the timbre intended by the person who originally mixed the soundtrack to be realized when the sound track is played in a small room having a neutral loudspeaker-room response.

In a further aspect of the invention directed to all sizes of room from small (home-sized) rooms to large (theatre-sized) auditoriums, the overall listening impression can be improved even further by adding surround channel timbre correction to compensate for the differences in listener-perceived timbre between the main channels and the surround channel. As mentioned above, the inventor believes that there are two principal causes for listener-perceived timbral differences between the main and surround channels: comb filter effects that arise when more than one loudspeaker reproduces the same channel of sound, and the human head related transfer function.

Comb filter effects can be greatly reduced or substantially suppressed by using only two surround loudspeakers and by decorrelating the surround channel information applied to them. However, because of the need to avoid exacerbating the timbre differences between the surround channel and the main channels, a decorrelation technique having neutral timbre must be employed.

With the timbral differences between the main and surround channels due to comb filter effects removed, as by the next-described aspect of the invention, the human head transfer function related timbre difference between the main and surround channels becomes the most noticeable factor. According to this aspect of the invention, a surround channel timbre correction according to a fixed correction characteristic determined by the inventor is provided in the surround channel of the playback system to eliminate or substantially reduce the difference between the listener-perceived surround channel timbre and the listener-perceived main channel timbre resulting from human head transfer function.

DETAILED DESCRIPTION OF THE INVENTION

Figure 1:
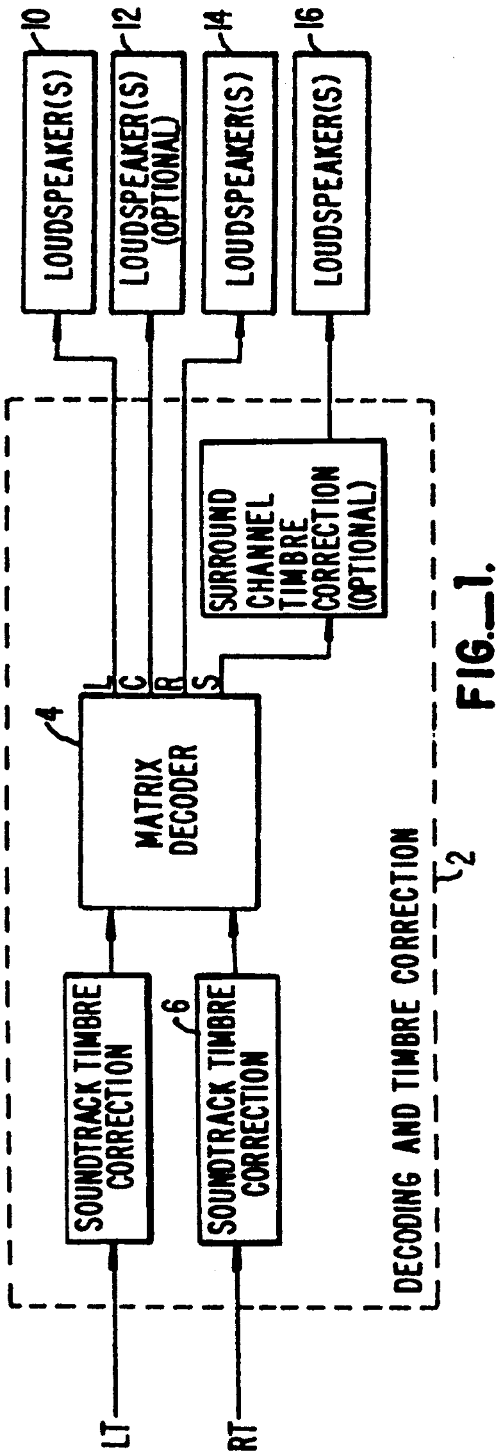
FIG. 1 is a block diagram of a surround-sound reproduction system embodying aspects of the invention.
Figure 2:
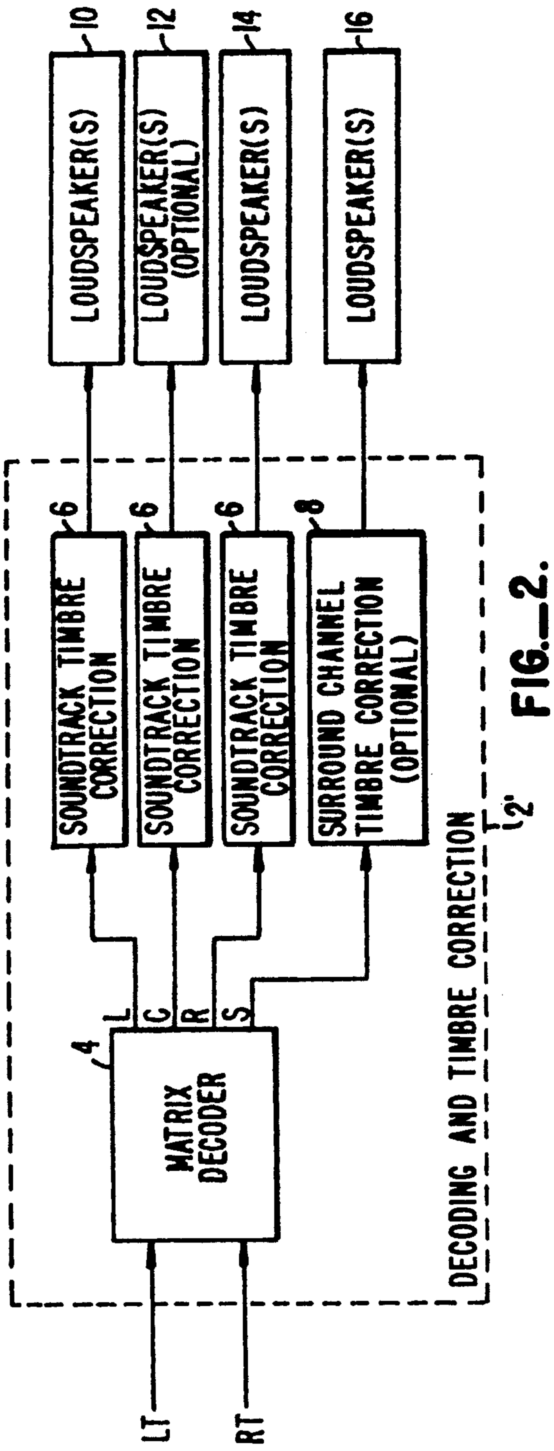
FIG. 2 is a block diagram of a surround-sound reproduction system embodying aspects of the invention.

FIGS. 1 and 2 show, respectively, block diagrams of two surround sound reproduction systems embodying aspects of the invention. FIGS. 1 and 2 are generally equivalent, although, for reasons explained below, the arrangement of FIG. 2 is preferred. Throughout the specification and drawings, like elements generally are assigned the same reference numerals; similar elements are generally assigned the same reference numerals but are distinguished by prime (′) marks.

In both FIGS. 1 and 2, left (L), center (C), right (R), and surround (S) channels, matrix encoded, according to well-known techniques, as left total ($L_T$) and right total ($R_T$) signals, are applied to decoding and soundtrack timbre correcting means 2 and 2′, respectively. Both decoding and soundtrack timbre correcting means 2 and 2′ include a matrix decoder that is intended to derive the L, C, R, and S channels from the applied $L_T$ and $R_T$ signals. Such matrix decoders, often referred to as "surround sound" decoders, are well-known. Several variations of surround sound decoders are known both for professional motion picture theater use and for consumer home use. For example, the simplest decoders include only a passive matrix, whereas more complex decoders also include a delay line and/or active circuitry in order to enhance channel separation. In addition, many decoders include a noise reduction expander because most matrix encoded motion picture soundtracks employ noise reduction encoding in the surround channel. It is intended that the matrix decoder 4 include all such variations.

In the embodiment of FIG. 1, soundtrack timbre correcting means 6 are placed in the respective $L_T$ and $R_T$ signal input lines to the matrix decoder 4, whereas in the embodiment of FIG. 2, the soundtrack timbre correcting means 6 are located in the L, C, and R output lines from the matrix decoder 4. The function of the soundtrack timbre correcting means 6 is explained below. In both the FIG. 1 and FIG. 2 embodiments, an optional surround channel timbre correcting means 8 is located in the S output line from the matrix decoder 4. The function of the surround channel frequency response correction means 8 is also explained below.

In both embodiments, the L, C, R, and S outputs from the decoding and soundtrack timbre correcting means 2 feed a respective loudspeaker or respective loudspeakers 10, 12, 14, and 16. In home listening environments the center channel loudspeaker 12 is frequently omitted (some matrix decoders intended for home use omit entirely a center channel output). Suitable amplification is provided as necessary, but is not shown for simplicity.

The arrangements of both FIGS. 1 and 2 thus provide for coupling at least the left, right, and surround (and, optionally, the center) sound channels encoded in the $L_T$ and $R_T$ signals to a respective loudspeaker or loudspeakers. The loudspeakers are intended to be located in operating positions with respect to a room in order to generate within the room sound fields responsive to at least the left, right, and surround (and, optionally, the center) channels.

Because of the requirement to preserve accurately the relative signal phase of the $L_T$ and $R_T$ input signals for proper operation of the matrix decoder 4, which responds to amplitude and phase relationships in the $L_T$ and $R_T$ input signals, the placement of the soundtrack timbre correcting means 6 (a type of filter, as explained below) before the decoder 4, as in the embodiment of FIG. 1, is less desirable than the alternative location after the decoder 4 shown in the embodiment of FIG. 2. In addition, the soundtrack timbre correcting means 6, if placed before decoder 4, may affect proper operation of the noise reduction expander, if one is employed, in the matrix decoder 4. The arrangement of FIG. 2 is thus preferred over that of FIG. 1. The preferred embodiment of soundtrack timbre correcting means 6 described below assumes that they are located after the matrix decoder 4 in the manner of the embodiment of FIG. 2.

If the soundtrack timbre correcting means 6 are located before the matrix decoder 4 in the manner of FIG. 1 it may be necessary to modify their response characteristics in order to minimize effects on noise reduction decoding that may be included in the matrix decoder 4. It may also be necessary to match carefully the characteristics of the two soundtrack timbre correcting means 6 (of the FIG. 1 embodiment) in order to minimize any relative shift in phase and amplitude in the $L_T$ and $R_T$ signals as they are processed by the soundtrack timbre correcting means 6.

Figure 3:
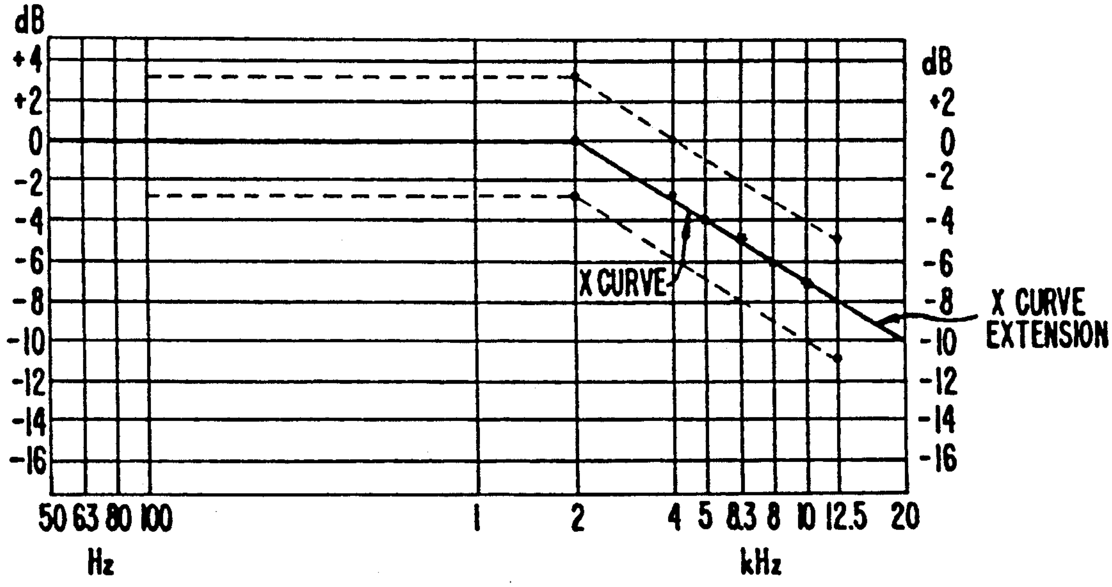
FIG. 3 is a loudspeaker-room response curve used by theaters, curve X of the International Standard ISO 2969-1977(E), extrapolated to 20 kHz.

FIG. 3 shows curve X of the International Standard ISO 2969-1977(E) with the response extrapolated to 20 kHz, beyond the official 12.5 kHz upper frequency limit of the standard. It is common practice in many theaters, particularly dubbing theaters and other theaters equipped with high quality surround sound systems, to align their response to an extended X-curve. The extended X-curve is a de facto industry standard. The X-curve begins to roll off at 2 kHz and is down 7 dB at 10 kHz. The extended X-curve is down about 9 dB at 16 kHz, the highest frequency employed in current alignment procedures for dubbing theaters. In public motion picture theaters, which are larger than dubbing theaters, the X-curve is extended only to 12.5 kHz because the attenuation of high frequency sound by the air becomes a factor above about 12.5 kHz in such large auditoriums.

The X-curve, and particularly its extension, which were originally intended to compensate exactly for the tendency of a loudspeaker to sound overly bright in a large room, are now known to have an excessive rolloff at high frequencies. As a result, a large room sound system aligned to the X-curve (or the extended X-curve), instead of sounding neutral as intended, sounds dull, except when playing program material (such as film soundtracks) that is specifically mixed for playback in such a room. In contrast to an X-curve- or extended X-curve-aligned large room sound system, a good quality modern consumer sound system designed for use in the home, although not aligned to a specific standard, tends not to have a similar excessive high-frequency roll-off. A modern consumer system in a small (home-sized) room may be characterized as sounding relatively neutral at high frequencies.

As explained above, in the creation of a motion picture soundtrack, the soundtrack is usually monitored in a dubbing theater that has been aligned to the extended X-curve, with the expectation that such motion picture films will be played in theaters that have been aligned to that standardized response curve. When creating the soundtrack, the mixing engineer has to boost the high-frequency content of the sound information recorded on the motion picture soundtrack to correct the excessive high-frequency roll-off in theater-sized auditoriums whose loudspeaker-room response is aligned to the X-curve. This results in a timbral error in the sound information recorded on the sound track, but this timbral error enables the soundtrack to sound neutral when played in large rooms aligned to the X-curve. However, for the reasons discussed above, the timbral error in the motion picture soundtrack is audible as an error when the soundtrack is played in home listening environment with a relatively neutral loudspeaker-room response. The motion picture soundtrack transferred to a home video medium has too much high frequency sound energy when reproduced by such a home system. The timbre of the soundtrack sounds incorrect, and details in the soundtrack can be heard that are not intended to be heard.

According to one aspect of this invention, soundtrack timbre correcting is provided to correct the boosted high-frequency content of motion picture soundtracks when such soundtracks are played back in small rooms. The soundtrack timbre correction characteristic was empirically derived using a specialized commercially-available acoustic testing manikin. The acoustic testing manikin was used to measure the steady-state one-third octave sound level spectrum of several representative extended X-curve-aligned large auditoriums, and of a good quality modern home consumer loudspeaker-room sound system. The soundtrack timbre correction characteristic represents the difference between these two sets of measurements.

Figure 4:
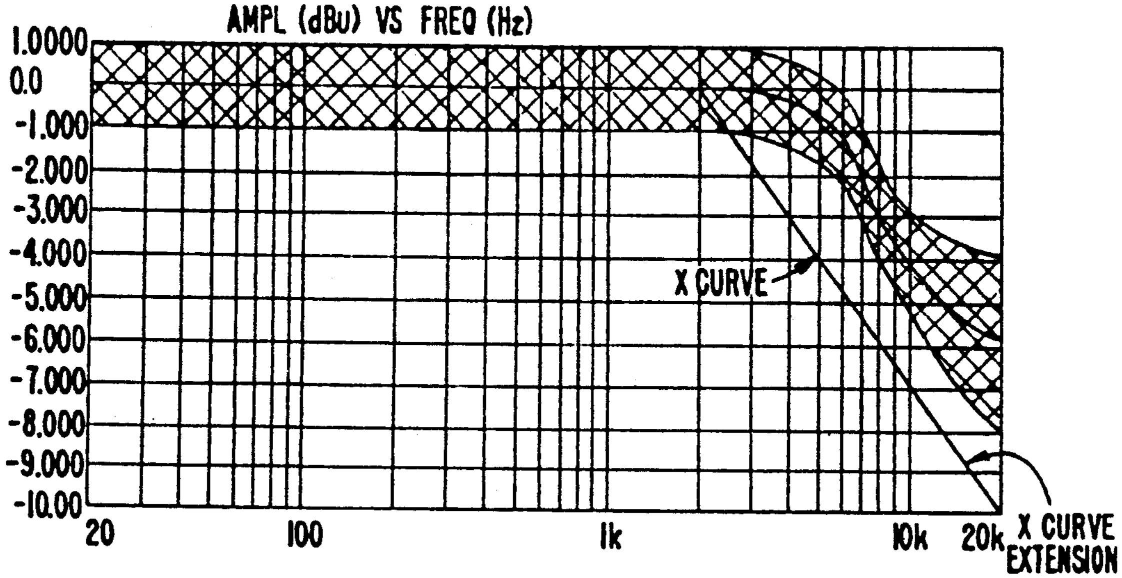
FIG. 4 is a correction characteristic, according to one aspect of this invention, to correct the timbre errors apparent in motion picture soundtracks when such soundtracks are played back in small rooms.

The correction characteristic is shown in FIG. 4 as a cross-hatched band centered about a solid line central response characteristic. The soundtrack timbre correction band takes into account an allowable tolerance in the correction of about $\pm 1$ dB up to about 10 kHz and about $\pm 2$ dB from about 10 kHz to 20 kHz, where the ear is less sensitive to variation in response. In practice, the tolerance for the initial flat portion of the characteristic, below about 2 kHz, may be tighter. The form of the soundtrack timbre correction characteristic is generally that of a low-pass filter with a shelving response: the characteristic is relatively flat up to about 4 to 5 kHz, exhibits a steep rolloff, and begins to flatten out above about 10 kHz. About 3 to 5 dB rolloff is provided at 10 kHz. The extended X-curve response is also shown in FIG. 4 for reference.

It will be appreciated that the optimum correction characteristic would change (or be eliminated altogether) if a modified X-curve standard were adopted and put into practice.

Figure 5:
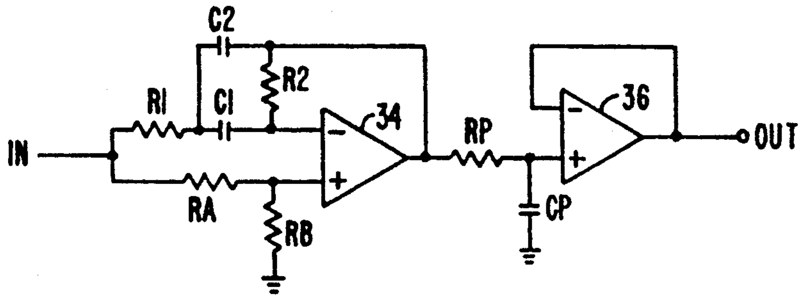
FIG. 5 is a schematic circuit diagram showing the preferred embodiment of a filter circuit for implementing the correction characteristic of FIG. 4.

A filter circuit can be implemented by means of an active filter, such as shown in FIG. 5, to provide a transfer characteristic closely approximating the solid central line of the correction curve band of FIG. 4. The correct frequency response for the filter is obtained by the combination of a simple real pole and a "dip" filter section. The real pole is realized by a single RC filter section with a $-3$ dB frequency of 15 kHz. The dip filter is a second order filter with a nearly flat response. The transfer function of the section is:

$$\frac{S^2+\gamma\frac{\omega_0}{Q}+\omega_0^2}{S^2+\frac{\omega_0}{Q}+\omega_0^2}$$

The complex pole pair and the complex zero pair have the same radian frequency but their angles are slightly different giving the desired dip in the frequency response with minimum phase shift. The same dip could be achieved with the zeros in the right half plane, but the phase shift would be closer to that of an allpass filter—180 degrees at the resonant frequency. The parameters of the dip section in the filter are:

$f_0=12.31$ kHz $Q=0.81$ $\gamma=0.733$ where $f_0=2\pi\omega_0$. Another way of interpreting these parameters is that the Q of the poles is 0.81 and the Q of the zeros if $0.81/\gamma$. The dip section can be realized by a single operational amplifier filter stage and six components as shown in FIG. 5. The filter stage in effect subtracts a bandpass filtered signal from unity giving the required transfer function and frequency response shape. The circuit topology, one of a class of single operational amplifier biquadratic circuits, is known for use as an allpass filter (PASSIVE AND ACTIVE NETWORK ANALYSIS AND SYNTHESIS by Aram Budak, Houghton Mifflin Company, Boston, 1974, page 451).

The rectangular coordinates of the poles and zeros of the overall filter are as follows (units are radians/sec in those locations on the s-plane):

Real Pole:

$a_{rp}=-9.4248\times10^4$

Complex Poles:

$a_p\pm j\beta_p=-4.7046\times10^4\pm j5.9962\times10^4$

Complex Zeroes:

$a_z\pm j\beta_z=-3.4485\times10^4\pm j6.7967\times10^4$

Figure 6:
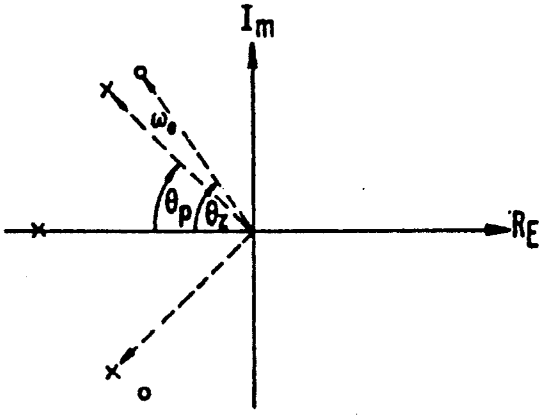
FIG. 6 is a diagram in the frequency domain showing the locations of the poles and zeros on the s-plane of the filter of FIG. 5.

FIG. 6 shows the location of the poles and zeros on the s-plane.

When implemented with the preferred component values listed below, the resulting characteristic response of the filter circuit of FIG. 5 is:

| Hz | dB | Hz | dB |
|---|---|---|---|
| 20 | 0.0 | 5k | −1.1 |
| 100 | 0.0 | 6k3 | −1.8 |
| 500 | 0.0 | 8k | −2.8 |
| 1k | 0.0 | 10k | −4.2 |
| 2k | −0.2 | 12k5 | −5.2 |
| 3k15 | −0.4 | 16k | −5.4 |
| 4k | −0.7 | 20k | −5.7 |

As mentioned above, there is an allowable tolerance of about ±1 dB up to about 10 kHz and about ±2 dB from about 10 kHz to 20 kHz. The preferred component values of the circuit shown in FIG. 5 are as follows:

| Component | 5% tolerance | 1% tolerance |
|---|---|---|
| R1 | 6k8 | 6k81 (6.81 kilohms) |
| R2 | 18k | 17k4 |
| C1 = C2 | 1n2 | 1n2 (1.2 nanofarads) |
| RA | 2k2 | 2k00 |
| RB | 10k | 10k0 |
| RP | 4k7 | 4k87 |
| CP | 2n2 | 2n2 |

The filter circuit of FIG. 5 is one practical embodiment of the soundtrack timbre correcting means 6 of FIG. 2. Many other filter circuit configurations are possible within the teachings of the invention.

In order to obtain the full sonic benefits of soundtrack timbre correction as just set forth, it is preferred that the arrangements of the FIG. 1 and FIG. 2 embodiments use the optional surround channel timbre correcting means 8. This correction compensates for the differences in listener-perceived timbre between the main and surround channels.

The following table shows the data for implementing the characteristic response of the desired correction to compensate for the listener-perceived timbre difference between the main and surround channels. The correction characteristic was empirically derived using a specialized commercially-available acoustic testing manikin to measure the steady-state one-third octave sound level spectrum of a loudspeaker in a small room. One set of data was measured with the loudspeaker placed in front of the manikin and a second set of data was measured with the loudspeaker placed to the side of the manikin. The two loudspeaker positions approximate the locations of the center and surround loudspeakers in a surround sound system. A further two sets of data were measured with an instrumentation microphone substituted for the acoustic testing manikin. The differences between the respective measurement microphone data and manikin data were subtracted to eliminate the effects of the specific room and loudspeaker. The correction characteristic was then derived by determining the difference between the corrected front data and the corrected side data.

| Hz | dB | Hz | dB |
|---|---|---|---|
| 1000 | 0.0 | 5161 | −2.3 |
| 1163 | −1.5 | 5910 | −4.2 |
| 1332 | −2.4 | 6767 | −5.8 |
| 1525 | −2.2 | 7749 | −5.6 |
| 1746 | −1.7 | 8873 | −3.6 |
| 2000 | −1.3 | 10161 | −1.8 |
| 2290 | −2.6 | 11634 | −2.0 |
| 2622 | −2.7 | 13322 | 0.0 |
| 3002 | −3.2 | 15254 | +0.5 |
| 3438 | −5.0 | 17467 | +1.4 |
| 3936 | −4.3 | 20000 | −1.0 |
| 4507 | −2.8 | | |

There is an allowable tolerance of about of about ±2 dB up to about 10 kHz and about ±4 dB from about 10 kHz to 20 kHz.

Figure 7:
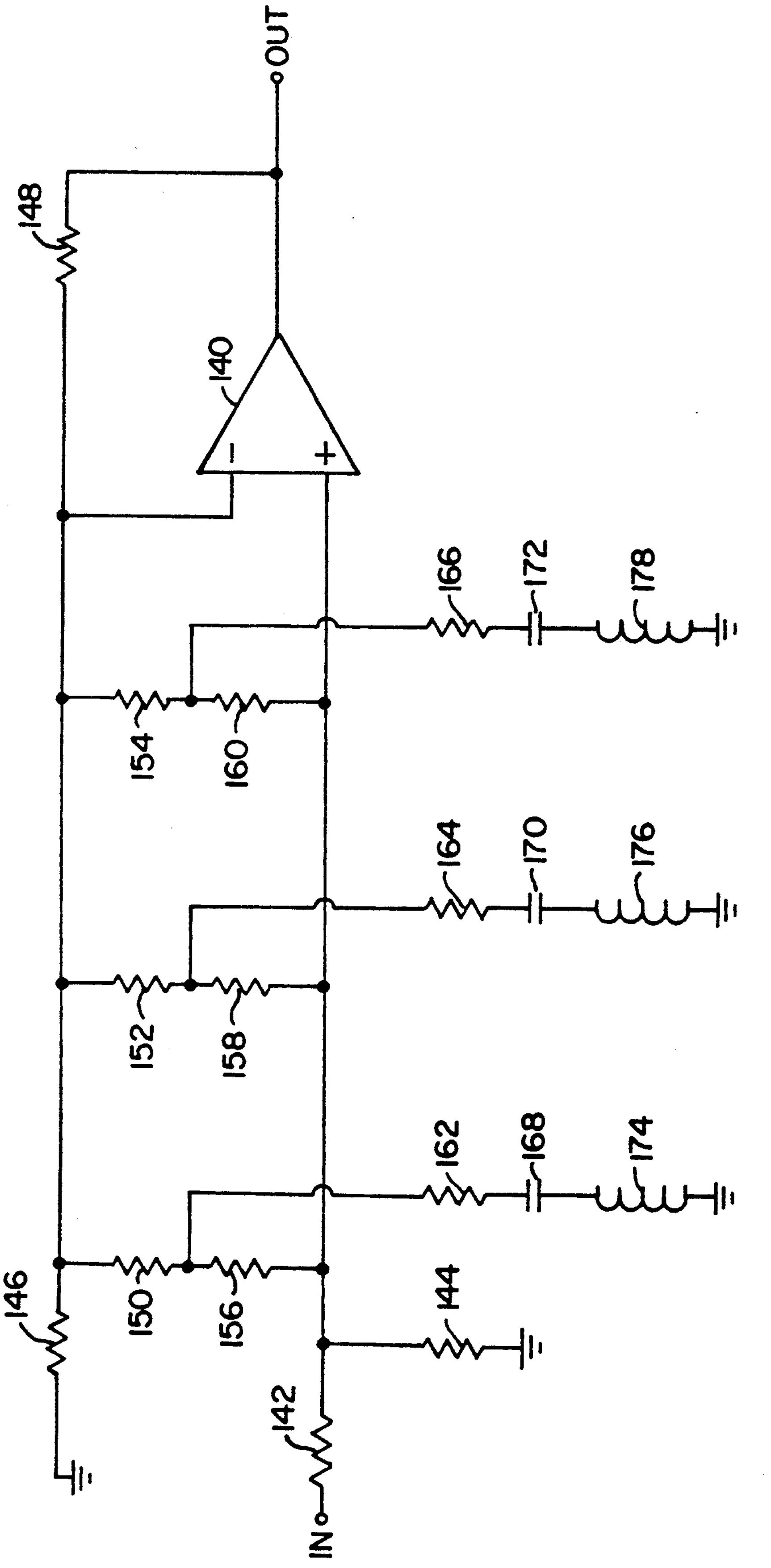
FIG. 7 is a schematic circuit diagram showing the preferred embodiment of a surround channel timbre correcting circuit for implementing the characteristic response of the desired correction to compensate for the listener-perceived timbre difference between the main and surround channels.

The preferred embodiment of the surround channel timbre correcting means 8, described below in connection with FIG. 7, is an active filter circuit that substantially implements (within about 1 dB) the correction data set forth in the table just above. It will be noted that the correction data extends up to 20 kHz even though the frequency response of the surround channel in the standard matrix surround sound system is limited to about 7 kHz by a low-pass filter. The surround channel timbre correcting circuit described in connection with FIG. 7 is intended for applications in which a 7 kHz low-pass filter is not present in the surround channel. In practical applications where the 7 kHz low-pass filter is present, it is preferred that the overall transfer function of the surround channel timbre correcting means 8 and the low-pass filter combine so as to substantially implement the correction data to the extend possible in view of the high-frequency rolloff of the low-pass filter. The design and implementation of such a surround channel timbre correcting circuit is well within the ordinary skill in the art.

FIG. 7 shows a schematic diagram of a practical embodiment of surround channel timbre correcting means 8 that implements (within about 1 dB) the correction data set forth in the table above. Surround channel timbre correcting means 8 is embodied in a three-section resonant active filter circuit. The circuit has a single operational amplifier 140 configured as a differential amplifier with frequency-dependent impedances between its positive and negative-going inputs. The impedances are each tuned series LCR circuits connected between the midpoint of respective voltage divider resistors and a reference ground. The preferred component values of the circuit shown in FIG. 7 are as follows:

| Component | Value |
|---|---|
| 142 | 10k ohms |
| 144 | 10k |
| 146 | 10k |
| 148 | 10k |
| 150 | 2k2 (2.2 kohms) |
| 152 | 4300 |
| 154 | 1k8 |
| 156 | 1250 |
| 158 | 1200 |
| 160 | 2k0 |
| 162 | 1k0 |
| 164 | 1k0 |
| 168 | 10n (nanofarads) |
| 170 | 9n |
| 172 | 5n |
| 174 | 300m (millihenries) |
| 176 | 75m |
| 178 | 150m |

The filter circuit of FIG. 7 is one practical embodiment of surround channel timbre correcting means 8 of FIGS. 1 and 2. Many other filter circuit configurations are possible within the teachings of the invention.

I claim:

1. A frequency response correction unit for use in a sound system for reproducing a motion picture soundtrack by means of at least one loudspeaker means in a relatively small room, compared to a motion picture theater, wherein said motion picture soundtrack is equalized for playback in a room whose room-loudspeaker system is aligned to the standard motion picture theater X-curve, comprising signal input means for receiving a signal derived from the motion picture soundtrack, soundtrack frequency response correcting means for receiving an input signal from the signal input means and changing the frequency response of the input signal to compensate for said X-curve equalization, and signal output means for receiving an output signal from the soundtrack frequency response correcting means and coupling the output signal to the loudspeaker means.

2. A frequency response correction unit for use in a sound system for reproducing a motion picture soundtrack by means of at least one loudspeaker in a relatively small room, compared to a motion picture theater, wherein said motion picture soundtrack is equalized for playback in a room whose room-loudspeaker system is aligned to the standard motion picture theater X-curve, comprising signal input means for receiving a signal derived from the motion picture soundtrack, and soundtrack frequency response correcting means for receiving an input signal from the signal input means and changing the frequency response of the input signal to compensate for said X-curve equalization.

3. A frequency response correction unit for use in a sound system for reproducing a motion picture soundtrack having a plurality of sound channels, including main sound channels and a surround sound channel, wherein when the main sound channels are reproduced by one or more loudspeakers located generally in front of a listener and the surround sound channel is reproduced by two or more loudspeakers generally to the sides of the listener, the main channel and surround channel loudspeakers producing sound fields each having both direct and diffuse sound field components, there is a listener-perceived difference in frequency response between sound fields produced by said surround sound channel and the main sound channels, comprising signal input means for receiving a signal derived from the motion picture soundtrack surround channel, surround channel frequency response correcting means for receiving an input signal from the signal input means and changing the frequency response of the input signal to correct the listener-perceived difference in frequency response between the surround sound channel and the main sound channels, wherein said surround channel frequency response correcting means corrects the listener-perceived difference in frequency response substantially in accordance with a correction characteristic corresponding to a characteristic representing the difference between a steady-state sound level spectra between a front loudspeaker position and a side loudspeaker position, the measurements of said spectra derived using an acoustic testing manikin and a measurement microphone, the differences between the measurement microphone and the manikin data having been subtracted to eliminate the effects of specific room and loudspeaker characteristics.

4. A frequency response correction unit for use in a sound system for reproducing a motion picture soundtrack having a plurality of sound channels, including main sound channels and a surround sound channel, wherein when the main sound channels are reproduced by one or more loudspeakers located generally in front of a listener and the surround sound channel is reproduced by two or more loudspeakers generally to the sides of the listener, the main channel and surround channel loudspeakers producing sound fields each having both direct and diffuse sound field components, there is a listener-perceived difference in frequency response between sound fields produced by said surround sound channel and the main sound channels, comprising signal input means for receiving a signal derived from the motion picture soundtrack surround channel, surround channel frequency response correcting means for receiving an input signal from the signal input means and changing the frequency response of the input signal to correct the listener-perceived difference in frequency response between the surround sound channel and the main sound channels, wherein said surround channel frequency response correcting means corrects the listener-perceived difference in frequency response substantially in accordance with a correction characteristic corresponding to a characteristic representing the difference between a steady-state sound level spectra between a front loudspeaker position and a side loudspeaker position, the measurements of said spectra derived using an acoustic testing manikin and a measurement microphone, the differences between the measurement microphone and the manikin data having been subtracted to eliminate the effects of specific room and loudspeaker characteristics, and signal output means for receiving an output signal from the surround channel frequency response correcting means and coupling the output signal to the surround loudspeakers means.

5. The frequency response correction unit of claim 4 or 3 wherein the frequency response of the surround channel frequency response correcting means, subject to a tolerance of about ±2 dB up to about 10 kHz and about ±4 dB from about 10 kHz to 20 kHz, is:

| Hz | dB | Hz | dB |
|---|---|---|---|
| 1000 | 0.0 | 5161 | −2.3 |
| 1163 | −1.5 | 5910 | −4.2 |
| 1332 | −2.4 | 6767 | −5.8 |
| 1525 | −2.2 | 7749 | −5.6 |
| 1746 | −1.7 | 8873 | −3.6 |
| 2000 | −1.3 | 10161 | −1.8 |
| 2290 | −2.6 | 11634 | −2.0 |
| 2622 | −2.7 | 13322 | 0.0 |
| 3002 | −3.2 | 15254 | +0.5 |
| 3438 | −5.0 | 17467 | +1.4 |
| 3936 | −4.3 | 20000 | −1.0. |
| 4507 | −2.8 | | |

6. The frequency response correction unit of claim 5 for use in a sound system for reproducing a motion picture soundtrack in a relatively small room, compared to a motion picture theater, wherein said motion picture soundtrack is equalized for playback in a room whose room-loudspeaker system is aligned to the standard motion picture theater X-curve, additionally comprising soundtrack frequency response correcting means, connected in tandem with the surround channel frequency response correcting means, for changing the frequency response of the input signal to compensate for said X-curve equalization.

7. The frequency response correction unit of claim 6 wherein the soundtrack frequency response correcting means has a transfer characteristic of a filter with a shelving response such that its characteristic response is relatively flat up to about 4 to 5 kHz, rolls off between about 4 to 5 kHz and about 10 kHz, and is relatively flat above about 10 kHz.

8. The frequency response correction unit of claim 7 wherein the soundtrack frequency response correcting means characteristic response, subject to a tolerance of about ±1 dB up to about 10 kHz and about ±2 dB from about 10 kHz to 20 kHz, is:

| Hz | dB | Hz | dB |
|---|---|---|---|
| 20 | 0.0 | 5k | −1.1 |
| 100 | 0.0 | 6k | −1.8 |
| 500 | 0.0 | 8k | −2.8 |
| 1k | 0.0 | 10k | −4.2 |
| 2k | −0.2 | 12k | −5.2 |
| 3k15 | −0.4 | 16k | −5.4 |
| 4k | −0.7 | 20k | −5.7. |

9. The frequency response correction unit of claim 4 or 3 for use in a sound system for reproducing a motion picture soundtrack in a relatively small room, compared to a motion picture theater, wherein said motion picture soundtrack is equalized for playback in a room whose room-loudspeaker system is aligned to the standard motion picture theater X-curve, and wherein the surround channel frequency response correcting means is additionally for changing the frequency response of the input signal to compensate for said X-curve equalization.

10. The frequency response correction unit of claim 9 wherein the frequency response of the surround channel frequency response correcting means, subject to a tolerance of about ±2 dB up to about 10 kHz and about ±4 dB from about 10 kHz to 20 kHz, is:

| Hz | dB | Hz | dB |
|---|---|---|---|
| 1000 | 0.0 | 5161 | −2.3 |
| 1163 | −1.5 | 5910 | −4.2 |
| 1332 | −2.4 | 6767 | −5.8 |
| 1525 | −2.2 | 7749 | −5.6 |
| 1746 | −1.7 | 8873 | −3.6 |
| 2000 | −1.3 | 10161 | −1.8 |
| 2290 | −2.6 | 11634 | −2.0 |
| 2622 | −2.7 | 13322 | 0.0 |
| 3002 | −3.2 | 15254 | +0.5 |
| 3438 | −5.0 | 17467 | +1.4 |
| 3936 | −4.3 | 20000 | −1.0. |
| 4507 | −2.8 | | |

11. The frequency response correction unit of claim 4 or 3 for use in a sound system for reproducing a motion picture soundtrack in a relatively small room, compared to a motion picture theater, wherein said motion picture soundtrack is equalized for playback in a room whose room-loudspeaker system is aligned to the standard motion picture theater X-curve, connected in tandem with the surround channel frequency response correcting means, for changing the frequency response of the input signal to compensate for said X-curve equalization.

12. The frequency response correction unit of claim 11 wherein the soundtrack frequency response correcting means has a transfer characteristic of a filter with a shelving response such that its characteristic response is relatively flat up to about 4 to 5 kHz, rolls off between about 4 to 5 kHz and about 10 kHz, and is relatively flat above about 10 kHz.

13. The frequency response correction unit of claim 12 wherein the characteristic response, subject to a tolerance of about ±1 dB up to about 10 kHz and about ±2 dB from about 10 kHz to 20 kHz, is:

| Hz | dB | Hz | dB |
|---|---|---|---|
| 20 | 0.0 | 5k | −1.1 |
| 100 | 0.0 | 6k | −1.8 |
| 500 | 0.0 | 8k | −2.8 |
| 1k | 0.0 | 10k | −4.2 |
| 2k | −0.2 | 12k | −5.2 |
| 3k15 | −0.4 | 16k | −5.4 |
| 4k | −0.7 | 20k | −5.7. |

14. The frequency response correction unit of claim 6 wherein said soundtrack frequency response correcting means compensates for said X-curve equalization substantially in accordance with a correction characteristic representing the difference between a steady-state one-third octave sound level spectra of representative extended X-curve-aligned theaters and a home consumer loudspeaker-room sound system.

15. The frequency response correction unit of claim 1 or 2 wherein said soundtrack frequency response correcting means compensates for said X-curve equalization substantially in accordance with a correction characteristic representing a difference between a steady-state one-third octave sound level spectra of representative extended X-curve-aligned theaters and a home consumer loudspeaker-room sound system.

16. The frequency response correction unit of claim 1 or 2 wherein the soundtrack frequency response correcting means has a transfer characteristic of a filter with a shelving response such that its characteristic response is relatively flat up to about 4 to 5 kHz, rolls off between about 4 to 5 kHz and about 10 kHz, and is relatively flat above about 10 kHz.

17. The frequency response correction unit of claim 16 wherein the frequency response correcting means characteristic response, subject to a tolerance of about ±1 dB up to about 10 kHz and about ±2 dB from about 10 kHz to 20 kHz, is:

| Hz | dB | Hz | dB |
|---|---|---|---|
| 20 | 0.0 | 5k | −1.1 |
| 100 | 0.0 | 6k | −1.8 |
| 500 | 0.0 | 8k | −2.8 |
| 1k | 0.0 | 10k | −4.2 |
| 2k | −0.2 | 12k | −5.2 |
| 3k15 | −0.4 | 16k | −5.4 |
| 4k | −0.7 | 20k | −5.7. |

* * * * *

UNITED STATES PATENT AND TRADEMARK OFFICE

CERTIFICATE OF CORRECTION

PATENT NO. : 5,189,703

DATED : February 23, 1993

INVENTOR(S) : Holman

It is certified that error appears in the above-indentified patent and that said Letters Patent is hereby corrected as shown below:

On the title page: Item [54] and Column 1, line 1

Title: replace title with --Frequency Response Compensation for Motion Picture Soundtrack X-Curve Equalization or for Listener-Perceived Surround Channel to Main Channel Frequency Response Differences--

Column 04
Line 40: "surrounds" should be --surround--

Column 04
Line 51: "along" should be --alone--

Column 09
Line 24: "if" should be --is--

Column 10
Line 58: delete second "of about"

Column 11
Line 09: "extend" should be --extent--

UNITED STATES PATENT AND TRADEMARK OFFICE

CERTIFICATE OF CORRECTION

PATENT NO. : 5,189,703

DATED : February 23, 1993

INVENTOR(S) : Holman

It is certified that error appears in the above-indentified patent and that said Letters Patent is hereby corrected as shown below:

Column 11
Line 41: insert --166-- in first column of table and --1k0-- in second column of table Column 14
Line 66: insert --soundtrack frequency response correcting means-- between "wherein the" and "characteristic"

Signed and Sealed this

Eighteenth Day of October, 1994

Attest:

Bruce Lehman

BRUCE LEHMAN

*Attesting Officer* *Commissioner of Patents and Trademarks*